United States Patent [19]

Ide et al.

[11] Patent Number: 4,868,891
[45] Date of Patent: Sep. 19, 1989

[54] INTERRUPTED AUDIO FILL-IN SYSTEM FOR NOISE REDUCTION AND INTELLIGIBILITY ENHANCEMENT IN MULTI-CHANNEL SCANNING RECEIVER APPLICATIONS

[75] Inventors: John D. Ide; John P. Fussell, both of Raleigh; Aaron S. Rogers, Knightdale, all of N.C.

[73] Assignee: Teletec Corporation, Raleigh, N.C.

[21] Appl. No.: 30,594

[22] Filed: Mar. 27, 1987

[51] Int. Cl.[4] .............................................. H04B 11/16
[52] U.S. Cl. .................................... 455/166; 455/161; 369/7
[58] Field of Search ............... 455/161, 166, 185, 186, 455/76, 77, 168, 184, 18, 179; 369/996, 131; 340/825.03, 825.5, 825.11, 825.13, 825.15; 379/73, 68, 88; 375/104

[56] References Cited

U.S. PATENT DOCUMENTS

| | | |
|---|---|---|
| 3,497,813 | 2/1970 | Gallagher . |
| 3,801,914 | 4/1974 | Imazeki . |
| 3,974,338 | 8/1976 | Luzier et al. ............................ 369/2 |
| 4,066,847 | 1/1978 | Giordano ............................. 379/161 |
| 4,509,203 | 4/1985 | Yamada ................................ 455/166 |
| 4,603,438 | 7/1986 | Fillman ................................ 455/166 |
| 4,608,702 | 8/1986 | Fedde ................................... 455/166 |
| 4,682,370 | 7/1987 | Matthews ............................. 455/166 |

FOREIGN PATENT DOCUMENTS 001213  1/1979  Japan .................................. 455/166

*Primary Examiner*—Robert L. Griffin
*Assistant Examiner*—Curtis Kuntz
*Attorney, Agent, or Firm*—Breneman & Georges

[57] ABSTRACT

A method and apparatus for filling audio blanks in a message received by a receiver resulting from switching the receiver between a plurality of input channels each having a different message for selecting the channel of highest priority is disclosed. A recording and playback device is connected between the receiver and an output channel for recording a given time segment portion of a first message. The receiver is switched to a second channel for a period of time equal to the given time segment for receiving a second message and for determining which channel has a higher priority. The recorded portion of the first message is delivered to the output channel simultaneously with the switching of the receiver to the second channel to repeat the first message portion at the output channel, thereby to fill in the audio blank resulting from switching the receiver between the input channels.

20 Claims, 1 Drawing Sheet

INTERRUPTED AUDIO FILL-IN SYSTEM FOR NOISE REDUCTION AND INTELLIGIBILITY ENHANCEMENT IN MULTI-CHANNEL SCANNING RECEIVER APPLICATIONS

CROSS REFERENCE TO RELATED APPLICATIONS

The invention pertains to a novel system for filling in audio blanks that is interrelated to the subject matter of the following related copending patent applications entitled:(1) COMPUTERIZED MULTISTANDARD, FIELD-CONVERTIBLE, MULTIREGIONAL/MULTISERVICE, REMOTE CONTROLLABLE, REMOTE PROGRAMMABLE MOBILE TWO-WAY RADIO SYSTEM WITH DIGITAL SERIAL BUS LINK, BUILT-IN PROGRAMMER AND AUTODIAGNOSTICS, U.S. Application Ser. No. 030,743, filed on Mar. 27, 1987; and (2) BIDIRECTIONAL DIGITAL SERIAL INTERFACE FOR COMMUNICATION DIGITAL SIGNALS INCLUDING DIGITIZED AUDIO BETWEEN MICROPROCESSOR-BASED CONTROL AND TRANSCEIVER UNITS OF TWO-WAY RADIO COMMUNICATIONS EQUIPMENT, U.S. Application Ser. No. 031,003, filed on Mar. 27, 1987.

BACKGROUND OF THE INVENTION

The present invention relates to an improved method and apparatus for filling in the audio blanks in a message as received by a receiver resulting from switching the receiver between a plurality of input channels each having a different message for selecting the channel of highest priority.

In a radio receiving system with multi-channel input capability, the input channels are often assigned an order of priority with respect to the importance of the messages that are to be received. When a channel is in use and another channel of higher priority becomes active, important benefits, including improved receiver efficiency, would be gained if the receiver could sense the activity of the higher priority channel and automatically switch from the first channel to the one of higher priority.

Due to redundant characteristics of normal speech when observed in short segments of, for example, between 1 and 250 ms, it is possible to periodically remove a small portion of these segments without losing the intelligibility of the speech. A receiving system could utilize this phenomenon to allow it to periodically switch from a channel in use to one of higher priority and to make a decision to return to the original channel if the higher priority channel is inactive or may be switched to remain connected with the higher priority channel if that channel is active. Although this type of speech interruption does not significantly reduce intelligibility, the resultant loss of small speech segments is obvious to the ear and can result in fatigue for some listeners.

DESCRIPTION OF THE PRIOR ART

Multi-channel priority receivers are well-known in the patented prior art as evidenced by the U.S. Pat. Nos. Gallagher 3,497,813 and Imazeki 3,801,914. The Gallagher patent, for example, discloses a multi-frequency receiver with automatic channel selection and priority channel monitoring. The receiver includes a local oscillator and a tone detector to monitor different frequency channels. A priority channel is intermittently sampled during reception and the receiver is connected with the priority channel when a carrier signal is on the priority channel. The Imazaki patent discloses a priority-frequency system for a signal-seeking receiver for automatically tuning the receiver to the priority signal whenever it is received.

While the prior devices normally operate satisfactorily, they each suffer from certain inherent drawbacks in efficiency since each prior system includes a certain amount of dead time resulting from the intermittent sampling of the priority channel.

The present invention was developed in order to overcome these and other drawbacks of the prior devices by providing an audio blanking fill in method and apparatus for multi-channeled audio/data systems.

SUMMARY OF THE INVENTION

Accordingly, it is a primary object of the present invention to provide a method and apparatus for filling in the audio blanks in a message received by a receiver resulting from switching the receiver between a plurality of channels having different messages for selecting the channel of highest priority. The apparatus includes a recording device connected with the receiver for recording at least a portion of a message from one of the input channels, an output channel, and a switch for selectively connecting the receiver and the recording device with the output channel. A control device is connected with the receiver and with the recording device for controlling the selective connection of the switch in accordance with switching of the receiver between the plurality of input channels. More particularly, the control device activates the recording device to record the message portion from the one input channel and subsequently switches the receiver to a second input channel and switches the switch to the recording device. Accordingly, a second message will be delivered to the receiver and the recorded message portion will be delivered to the output channel to fill in the blank resulting from switching to another channel. The receiver provides a valid message signal to the control device which is processed by the control device to determine the input message channel of higher priority. The control device then controls the switching of the receiver to the plurality of input channels and the operation of the output channel switch in accordance with the channel priority.

According to a more specific object of the invention, the recording device includes a record/playback mechanism including an array of addressable read/write memory elements which are switched between write and read modes of operation by the control device.

According to a further object of the invention, the recording device includes an analog to digital converter connected between the receiver and the storage array for converting the message to digital form and a digital to analog converter connected between the storage array and the output channel for converting the digital message back to analog form.

DESCRIPTION OF THE DRAWINGS

These and other objects of the invention will become apparent from a study of the following specification when viewed in the light of the accompanying drawing, in which.

DETAILED DESCRIPTION OF THE INVENTION

The audio blank fill-in method and apparatus of the present invention is founded on the concept of substituting a pre-recorded message segment for a lost message segment resulting from periodic switching of a receiver between channels of different priority. More particularly, if a segment of speech, equal in time to the length of time the receiver is switched to a higher priority channel, is recorded immediately prior to the switch, that segment will closely approximate the segment that is lost during the time segment the receiver is switched to the higher priority channel. By reproducing the recorded segment in place of the lost segment, most listeners will be unaware of any loss of intelligibility or increase in fatigue.

Figure 1:
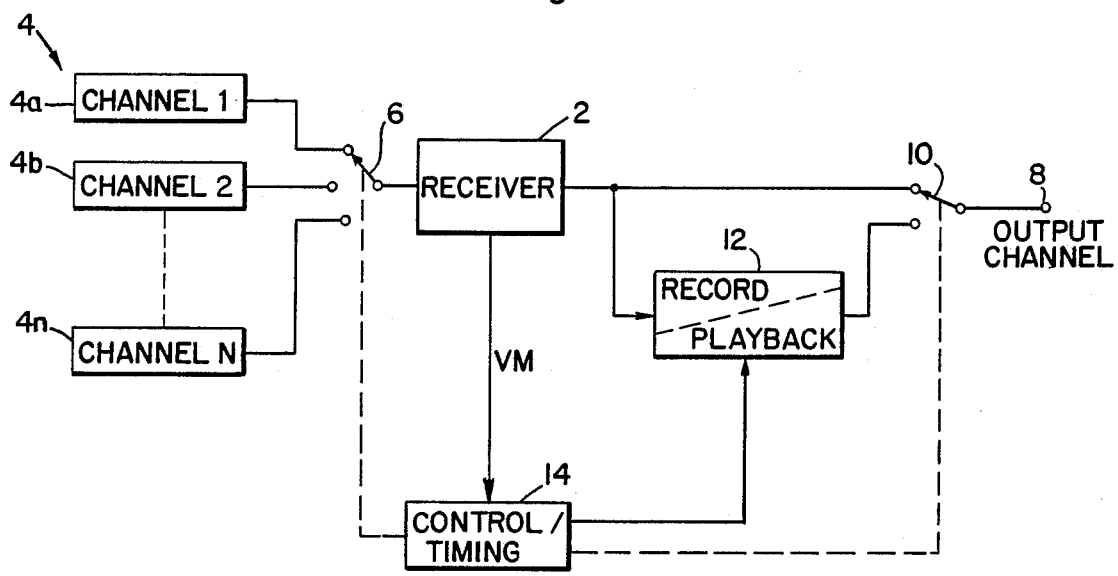
FIG. 1 is a schematic diagram of the audio blanking fill-in system for a priority multi-channel receiver according to the invention.

The basic apparatus for performing the audio blanking fill-in is shown in FIG. 1. A receiver 2 is connected with a plurality of input channels 4 via a switch 6. Each input channel is adapted to receive a different input message which may be transmitted, for example, at a different frequency. At least one of the input channels is assigned a higher priority than the remaining channels, i.e. for receiving important messages. Alternatively, all of the channels may be assigned different priority levels. The output of the receiver 2 is connected with an output channel 8 via a second switch 10. The output channel may be connected with a loudspeaker, a storage device, or other hardware (not shown) for ultimate reception of the various messages received from the plurality of channels.

A record/playback device 12 is connected with the output of the receiver 2 and with the second switch 10, whereby the output channel 8 may be selectively connected with either the receiver 2 or the record/playback device 12. The record/playback device is operable for recording segments of a message from the input channel with which the receiver 2 is connected. Thus with the connection shown in FIG. 1, the record/playback device would record segments of the message from the first input channel 4a, while the output channel receives the message directly from the receiver.

A microprocessor control and timing mechanism 14 is connected between the receiver and the record/playback device for controlling the operation of the first and second switches 6 and 10. The control mechanism periodically operates the first switch 6 to connect the receiver 2 with a different channel 4b. . . 4n for a given segment of time. The control and timing mechanism also controls the record/playback device to record segments of messages having a time corresponding with the time segment during which the first switch is periodically operated. The control mechanism also operates the second switch 10 simultaneously with operation of the first switch 6 and activates the playback mode of the record/playback device 12 to play back the segment of the message recorded immediately prior to switching of the switches 6 and 10 to the output channel.

So long as the channel with which the receiver is connected is active, a valid message signal VM will be transmitted from the receiver 2 to the control device 14. This valid message signal is used by the control device to determine which channel has a higher priority.

Thus, for example, if the receiver is switched from active channel 1 to channel 2 and channel 2 is active, a valid message signal will be transmitted to the control device. If the control device determines that channel 2 has a lower priority than channel 1, the control device will switch the first switch 6 back to channel 1 at the end of the given segment of time, and will simultaneously switch the second switch 10 from the record/playback device 12 back to the receiver, and will also simultaneously switch the record/playback device from its playback mode to its record mode. On the other hand, if the control device determines that channel 2 has a higher priority than channel 1, the switch 6 remains connected with channel 2 while the switch 10 is switched back to the receiver and the record/playback device 12 is switched from the playback to the record mode simultaneously at the end of the given time period under control of the control device 14.

The control device 14 controls the periodic switching of the switch 6 to selectively connect the remaining channels with the receiver in a like manner. Should any channel with which the receiver is connected become inactive, the receiver will not provide a valid message signal to the control device. The control device then automatically operates the switch 6 to connect the receiver with a different channel.

It is important to note that the second switch 10 is only connected with the record/playback device when the device is in the playback mode, the time period of which corresponds with the given time period set by the control/timing device 14. Accordingly, the output channel 8 only receives recorded message segments during the "dead" time resulting from the periodic switching of the first switch 6 between the different input channels. At all other times, the output channel receives messages directly from the receiver 2 and the record/playback device records message segments from the input channel with which the receiver is connected.

Figure 2:
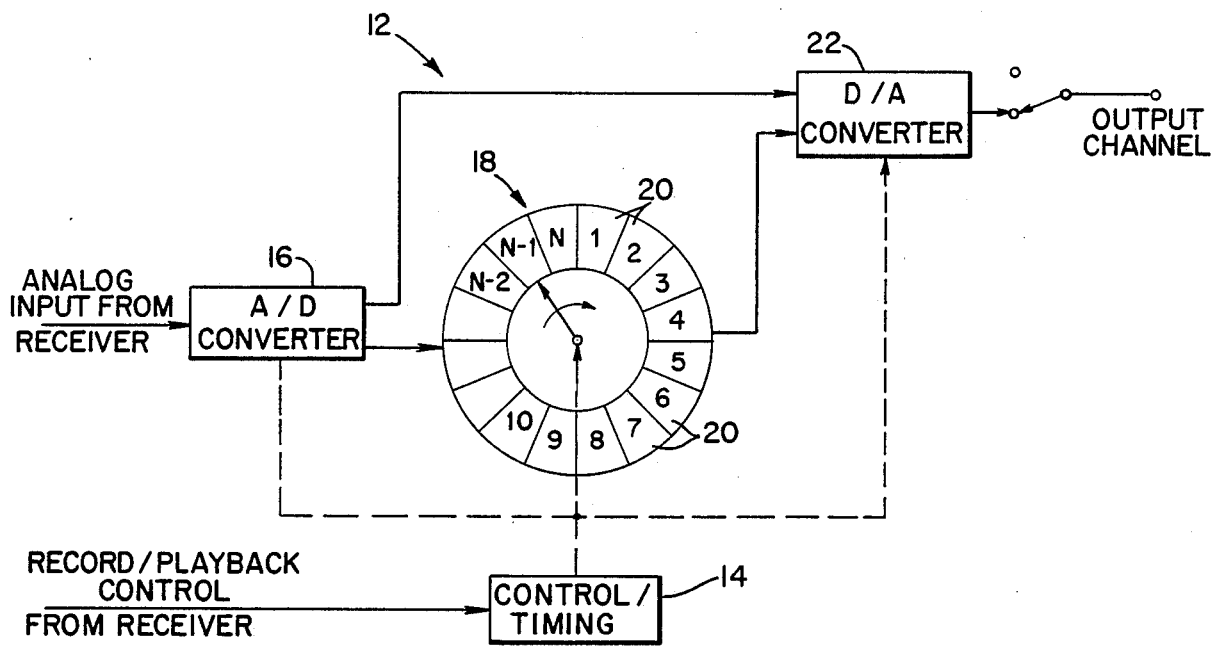
FIG. 2 is a schematic diagram of the record/playback device according to the invention.

A specific embodiment of the record/playback device 12 is shown in FIG. 2. Since the incoming messages from all of the channels and the receiver are in analog form, an analog to digital (A/D) converter 16 is provided to convert the messages to digital form by sampling at a rate determined by the control/timing device 14. The digital messages or message signals are delivered to a circular array storage device 18 comprising a plurality of addressable read/write memory elements 20. The memory elements are addressed and switched between write and read modes of operation by the control/timing device 14 for recording and playing back message segments. The number of elements 20 in the storage array 18 is determined by multiplying the sampling rate by the length of time a segment of the input message must be stored. The memory elements are addressed sequentially at a rate identical to the sampling rate of the A/D converter 16, and this method of addressing the elements is continuous and does not change with record/playback mode changes. When the last element has been addressed, the first element is then addressed with the next digital sample. The circular arrangement, when recording signals, results in a continuously updated record of the input signal. Switching of the storage array to the playback mode may be done at any time without regard to the address supplied to the array. A digital to analog (D/A) converter 22 is connected with the outputs of the A/D converter 16 and the storage array 18 for converting the digital signals back to analog form prior to delivery to the output channel 8. The D/A converter 22 receives its input from the A/D converter 16 when the storage array 18 is in the record mode and from the array when the array is in the playback mode as controlled by the control/timing device.

While in accordance with the provisions of the Patent Statute the preferred forms and embodiments of the invention have been illustrated and described, it will become apparent to those skilled in the art that various changes and modifications may be made without deviating from the inventive concepts set forth above.

What is claimed is:

1. Apparatus for filling audio blanks in a message received by a receiver resulting from switching the channels between a plurality of input channels each having a different message and a different priority comprising:
   (a) receiver;
   (b) at least two input channels;
   (c) a first switch means operatively connected between said receiver and said at least two input channels;
   (d) an output channel;
   (e) a record playback means operatively connected to said receiver;
   (f) a second switch means for selectively connecting said output channel with said record playback means and said receiver; and
   (g) a control means connected to said receiver and said record playback means for controlling the selective connection of said first switch means with one of said at least two input channels and said receiver said control means further controlling the selective connection of said second switch means with said output channel and said record playback means and said receiver said control means actuating the playback of said record playback means and connecting said second switch with said record playback means for a period of time substantially equal to the time said first switch is operated.

2. The apparatus as defined in claim 1 wherein said control means includes a timing device for determining the length of time during which a message is recorded by said record playback means and during which said second switch means is connected with said record playback means.

3. The apparatus as defined in claim 2 wherein said record playback means further comprises an array of addressable read/write memory elements which are switched between write and read modes of operation by said control means.

4. The apparatus as defined in claim 3 wherein said record playback means further includes an analog to digital converter operatively connected between said receiver and said array of addressable read/write memory elements for converting said message to digital form to provide a digital message and a digital to analog converter connected between said array and said output channel for converting said digital message back to analog form.

5. The apparatus as defined in claim 4 wherein said control means operates said analog to digital converter to deliver said digital message directly to said digital to analog converter during a recording mode of operation of said array of addressable read/write memory elements and said array delivers a previously recorded digital message to said digital to analog converter during a playback mode of operation of said array.

6. A method for filling audio blanks in a receiver resulting from switching input channels comprising the steps of:
   (a) determining the period of time required to switch from a first channel to a second channel;
   (b) constantly recording and updating a segment of the information conveyed on said first channel for a period of time substantially equal to said period of time required to switch from said first channel to said second channel;
   (c) switching said first channel to said second channel; and
   (d) playing back said recorded and updated segment of information conveyed on said first channel substantially simultaneously with said step of switching said first channel to said second channel for a period of time substantially equivalent to said period of time required to switch from said first channel to said second channel.

7. The method as defined in claim 6 further comprising the step of analyzing said first and second channel for message signals to determine the input channel of higher priority.

8. The method as defined in claim 7 further comprising the step of switching back to the first input channel when the first channel has a priority higher than the second channel, with said first message being delivered to said output channel in place of said recorded portion for a period of time substantially equivalent to the period of time required to switch from said first channel to said second channel and back to said first channel.

9. The method as defined in claim 7 further comprising the step of switching said output channel from said recorded message to said second message from the receiver when the second message channel has a priority higher than the first message channel for a period of time substantially equivalent to the period of time required to switch from said first channel to said second channel.

10. The method as defined in claim 7 further comprising repeating the recording, switching, playing back, and determining steps for the remaining input channels.

11. The method as defined in claim 10 further comprising the step of simultaneously controlling the switching and playing back steps.

12. The method of filling audio blanks of claim 7 wherein said step of recording and updating includes an additional period of time substantially equivalent to said period of time necessary to determine priority and said step of playing back includes playing back said additional period of time substantially equivalent to said period of time necessary to determine priority.

13. The method of filling audio blanks of claim 12 wherein said step of recording and updating is for a period of between 1 and 250 milliseconds.

14. Apparatus for filling audio interrupt periods in a radio during a change in channels comprising:
   (a) a receiver;
   (b) a plurality of input channels;
   (c) a channel select means for the selective transmission of a signal from one of said plurality of input channels;
   (d) an output channel;
   (e) a record playback means operatively connected to said receiver and selectively to said output channel;

(f) a switch means for selectively connecting said output channel with said record playback means and said receiver; and (g) a control means operatively connected to said receiver, said channel select means, said switch means and said record playback means said control means operating said switch means to connect said output channel with said record playback means for a period of time substantially equal to the time of operation of said channel select means.

15. The apparatus of claim 14 wherein said control means determines the channel selected by said channel select means in accordance with a signal from said receiver.

16. The apparatus of claim 15 wherein said signal from said receiver contains information indicating a relative priority of channels transmitting a signal to said receiver.

17. The apparatus of claim 14 wherein said record playback means contains an array of addressable read/write memory elements and an analog to digital converter connected between said receiver and said array of addressable read/write memory elements to convert a signal from said receiver to digital form for storage in said array of addressable read/write memory elements and a digital to analog converter connected between said array of addressable read/write memory elements and said output switch to convert said signal from said array of addressable read/write memory elements to analog form.

18. The apparatus of claim 17 wherein the number of addressable read/write memory elements in said array of addressable read/write memory elements is substantially equal the product of the sampling rate of the analog to digital converter and the length of time a segment of the input message must be stored.

19. The apparatus of claim 14 wherein said control means consists of a micro-computer.

20. The apparatus of claim 14 wherein said control means consists of hard-wired sequential logic circuitry.

* * * * *